United States Patent [19]
Ozawa

[11] Patent Number: 5,506,620
[45] Date of Patent: Apr. 9, 1996

[54] RECORDING/REPRODUCING APPARATUS FOR PROVIDING INDICATIONS OF ABNORMAL STATES

[75] Inventor: Kazuhiko Ozawa, Kanagawa, Japan

[73] Assignee: Sony Corporation, Tokyo, Japan

[21] Appl. No.: 327,214

[22] Filed: Oct. 21, 1994

Related U.S. Application Data

[63] Continuation of Ser. No. 989,656, Dec. 14, 1992, abandoned.

[30] Foreign Application Priority Data

Dec. 18, 1991 [JP] Japan ................................. 3-353762

[51] Int. Cl.$^6$ ........................... H04N 5/225; H04N 5/222
[52] U.S. Cl. ............................................ 348/334; 348/333
[58] Field of Search ...................................... 348/207, 322,
348/373, 341, 333, 334; 340/636; 354/468,
471; H04N 5/225, 5/222

[56] References Cited

U.S. PATENT DOCUMENTS

| | | | |
|---|---|---|---|
| 4,855,781 | 8/1989 | Hoshino | 354/468 |
| 4,866,471 | 9/1989 | Ikuta | 354/468 |
| 4,999,665 | 3/1991 | Kuroda et al. | 354/468 |
| 5,081,483 | 1/1992 | Ishimura et al. | 354/412 |
| 5,105,180 | 4/1992 | Yamada et al. | 340/636 |
| 5,210,568 | 5/1993 | Miyake et al. | 354/418 |

FOREIGN PATENT DOCUMENTS

| | | | |
|---|---|---|---|
| 53-053998 | 5/1978 | Japan | G08B 23/00 |
| 58-15163 | 1/1983 | Japan | G01R 9/165 |
| 61-221672 | 10/1986 | Japan | G01R 9/165 |
| 62-227135 | 10/1987 | Japan | G03B 17/18 |
| 1-081445 | 3/1989 | Japan | H04H 3/08 |
| 2-280297 | 11/1990 | Japan | G08B 23/00 |

*Primary Examiner*—Joseph Mancuso
*Assistant Examiner*—Tuan V. Ho
*Attorney, Agent, or Firm*—William S. Frommer; Alvin Sinderbrand

[57] ABSTRACT

An electronic apparatus for providing indications on a display device representative of respective ones of a plurality of abnormal states of the apparatus. The apparatus includes a detection device for detecting a state of the electronic apparatus from among a plurality of states; a judgment device for judging whether the detected state is one of a plurality of predetermined abnormal states and for providing therefrom an output signal representative of the detected state; and a display controller device responsive to the output signal for controlling the display device so as to cause a respective indication to be displayed on the display device in a predetermined color. The display controller device may be arranged so as to control the display device so as to cause an indication representative of the remaining capacity of a battery to be displayed on the display device in one of a plurality of predetermined colors, in which the color of the indication is dependent upon the detected remaining capacity of the battery.

4 Claims, 8 Drawing Sheets

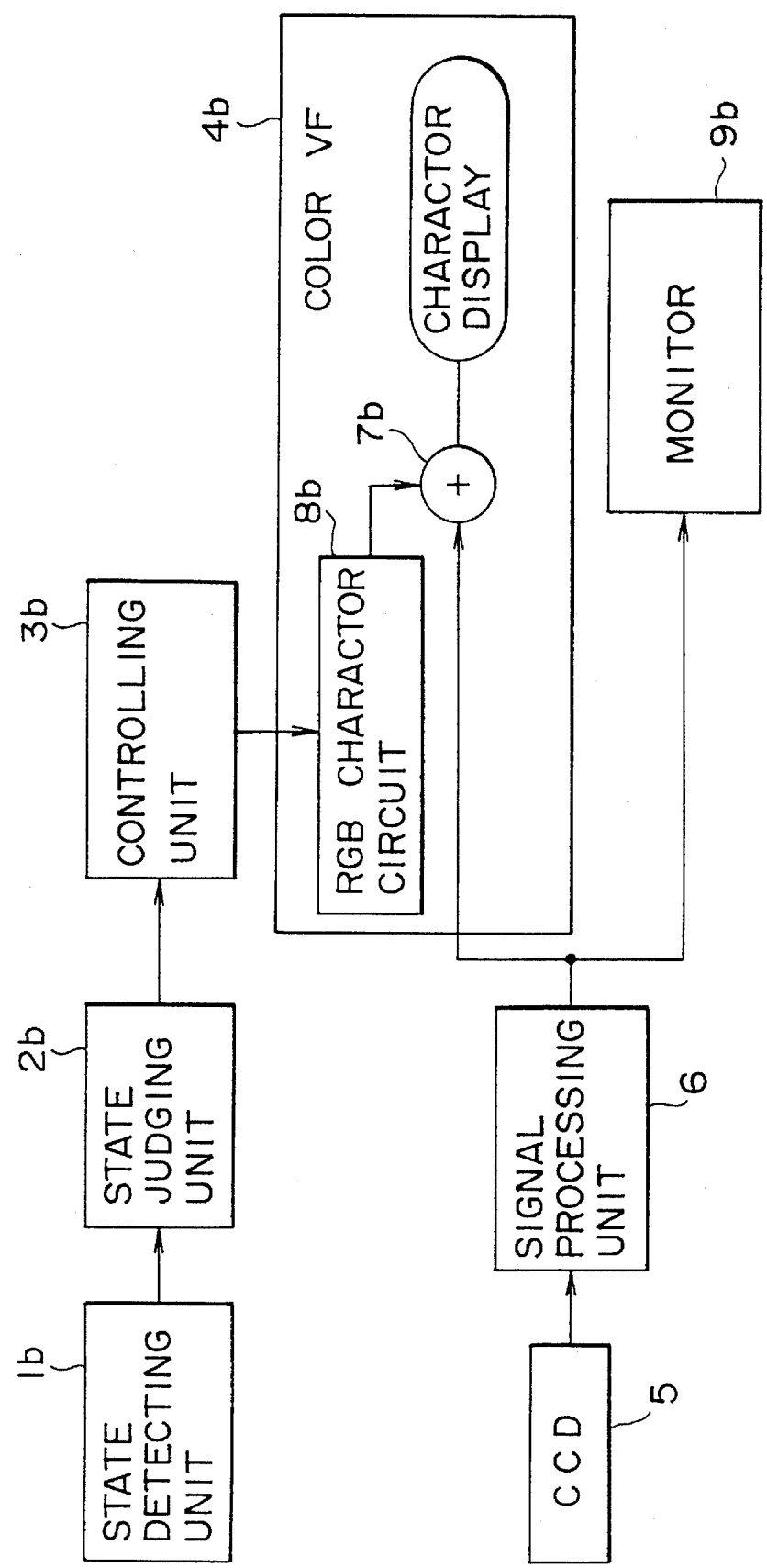

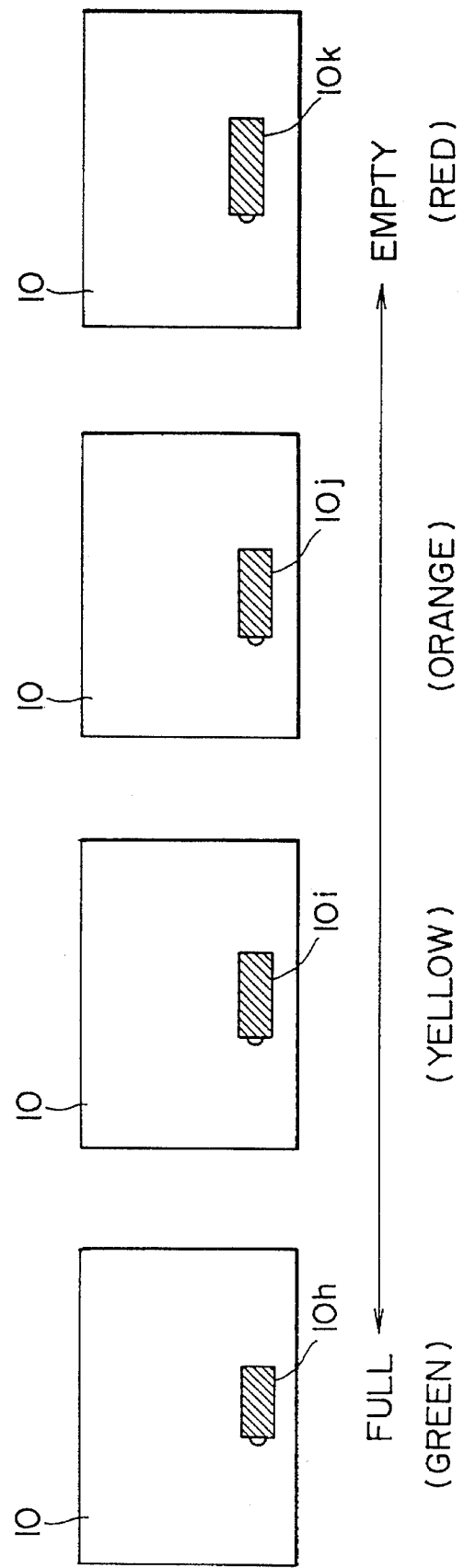

RECORDING/REPRODUCING APPARATUS FOR PROVIDING INDICATIONS OF ABNORMAL STATES

This application is a continuation of application Ser. No. 07/989,656, filed Dec. 14, 1992, now abandoned.

BACKGROUND OF THE INVENTION

The present invention relates to a recording and/or reproducing apparatus and, more particularly, to a video camera-recorder with a color view finder or a VTR with a monitor incorporated therein.

The view finders of video cameras most widely used so far are of a monochromatic CRT type and data for picture taking with the camera such as message with characters and warnings have been crowdedly displayed in the view finder in white color.

In for example a video camera or a VTR with a monitor incorporated therein, a warning display to indicate a state of tape end, dew condensation, or battery end has been displayed in flashing white color so as to be distinguished from a display of normal message with characters and to draw the attention of the user.

However, with the conventional video cameras of the described type, since displays of normal messages with characters and warnings have been made in the view finder in white color, it has been a problem that when the items to be displayed are increased, recognizability of them becomes worse and the normal character displays and the warning displays become undistinguishable.

As to the display of warning, in particular, since it has been attempted to draw attention of the user only by displaying it in flashing white color, it has been difficult to be recognized by every user for sure because of a difference in visual sensation or the like among individual users.

In the view finders of video cameras and VTRs with a monitor incorporated therein, there are some types which can display the remaining capacity of a battery. Such a display is similar to the fuel indication for example in the fuel gage of an automobile in which a scale is indicated between E (empty) and F (full). Therefore, there has been a problem that it is made difficult for the user to visually confirm the object through the view finder, which has the narrow display area.

SUMMARY OF THE INVENTION

Accordingly, an object of the present invention is to provide a recording and/or reproducing apparatus in which warning displays and the like are given in a distinguishable color so that the state of tape end, dew condensation, and battery end and the remaining capacity of the battery are easily recognized.

In order to solve the above mentioned problems, a recording and/or reproducing apparatus according to the present invention comprises state detection means for detecting a state of the recording and/or reproducing apparatus, information selection means for outputting information of characters and information of color indicating the state in response to the detection output from the state detection means, display controller means for controlling the display in response to the output from the information selection means, and color display means for displaying characters corresponding to the information of displayed color in response to the output from the display controller means.

The state detection means detects the state of the recording and/or reproducing apparatus and the information selection means outputs information of characters and information of color indicative of the state, selected according to the need, in response to the detection output from the state detection means.

The controller means controls the display in response to the information of characters and the information of color from the information selection means and the color display means displays characters corresponding to the information of color in response to the output from the controller means.

BRIEF DESCRIPTION OF THE DRAWINGS

FIG. 3 is a diagram showing a structure of an embodiment different from the embodiment of FIG. 2;

FIGS. 6(A)–6(D) are diagrams showing particular examples of displays of remaining battery capacity of a video camera according to the present invention;

DETAILED DESCRIPTION OF THE PREFERRED EMBODIMENTS

An embodiment of the present invention will be described below with reference to the accompanying drawings.

Figure 1:
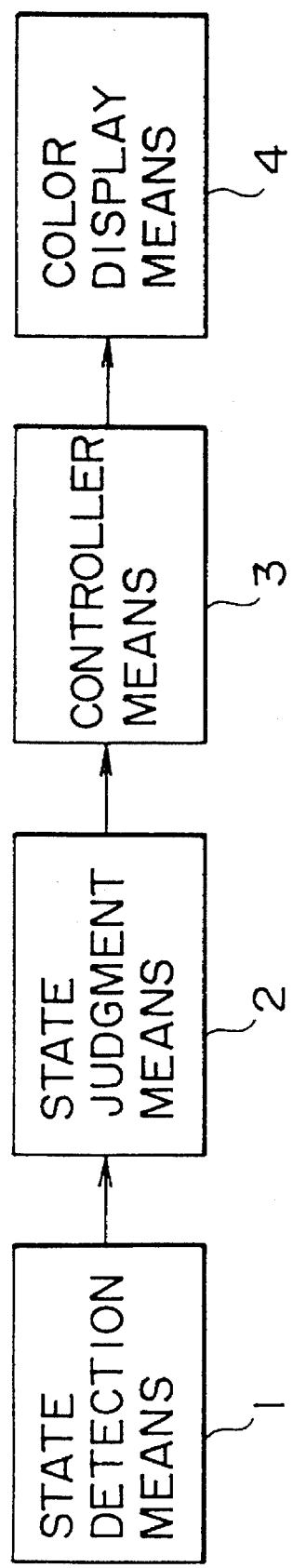
FIG. 1 is a block diagram showing a structure of a recording and/or reproducing apparatus as claimed of the present invention.
Figure 2:
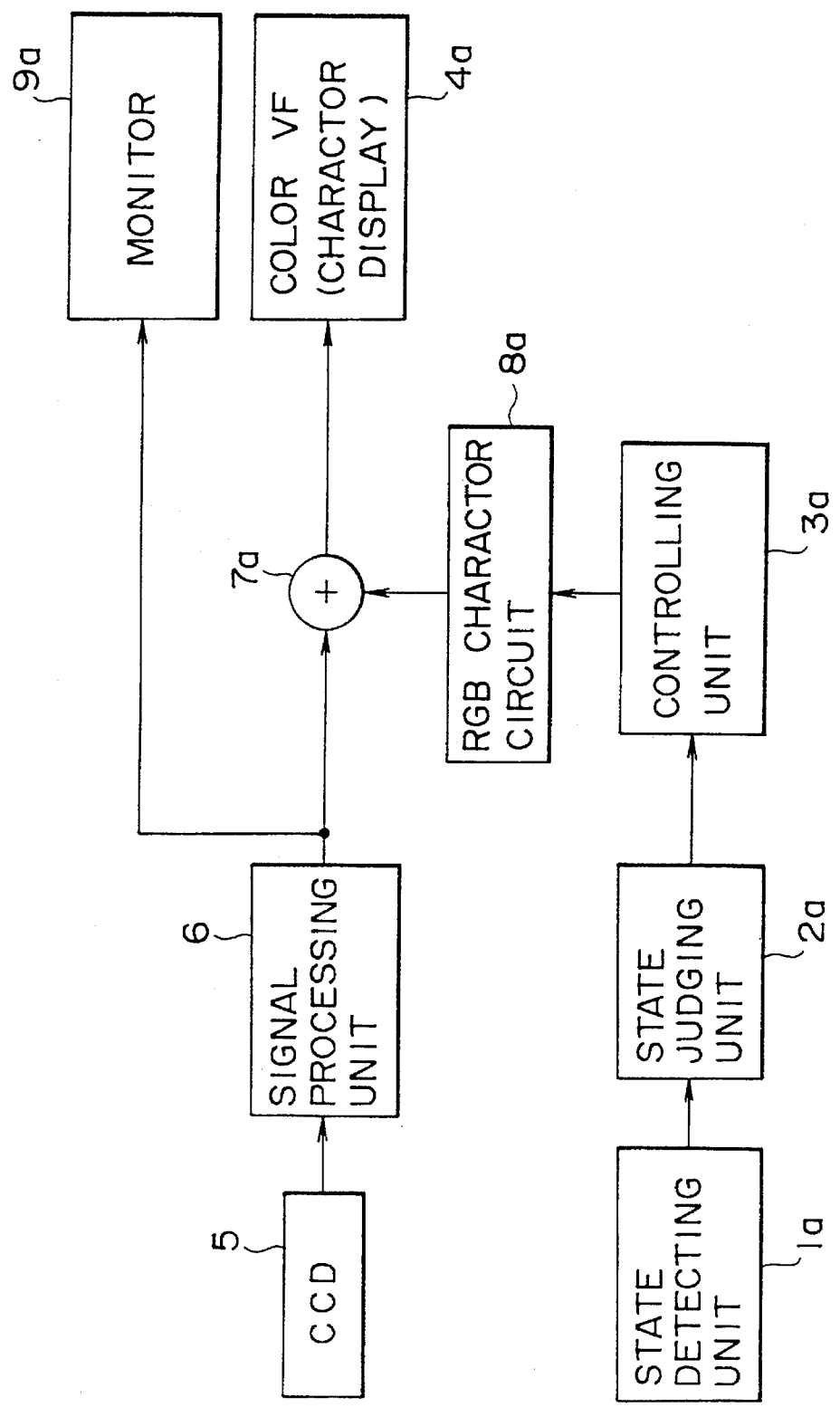
FIG. 2 is a diagram showing a structure of an embodiment of a video camera according to the present invention.

FIG. 1 is a block diagram showing the present invention and FIG. 2 is a diagram showing a structure of the present invention embodied in a video camera.

Referring to the drawings, reference numeral 1 denotes a state detection means for detecting a state of a recording/reproducing apparatus and the same is constituted of a state detecting unit 1a for detecting a state of the video camera in FIG. 2.

Reference numeral 2 denotes a state judgment means for judging whether or not the state is normal in response to a detection output from the state detection means 1 and the same is constituted of a state judging unit 2a in FIG. 2.

The detected state that is determined to be normal, here, includes for example the tape count, date, time, and operation mode. On the other hand, the detected state that is determined to be abnormal includes for example that of tape end, dew condensation, and battery end.

Reference numeral 3 denotes a controller means for controlling the display on a color display means 4 in response to the state judged by the state judgment means 2 and the same is constituted of a controlling unit 3a in FIG. 2.

When a state is judged to be normal by the state judgment means 2, namely, when the tape count, date, time, operation mode, or the like is detected, the controller means 3 controls the color display means 4 to display a pertinent indication by for example white characters or mark, as conventionally practiced.

On the other hand, when a state is judged to be abnormal, namely, a state of tape end, dew condensation, battery end, or the like is detected, the controller means 3 controls the color display means 4 to display an indication of a pertinent message or mark in for example red color which is easy to visually recognize. The controller means 3 may control the color display means 4 to display such a message or mark not only in a specific color but also in a flashing manner.

Reference numeral 4 denotes a color display means for displaying a state of the recording/reproducing apparatus and the same is constituted of a color view finder 4a in FIG. 2.

While a general arrangement of the present invention is described above, the case where the present invention is embodied in a video camera will be described below with reference to FIG. 2 in more detail.

Since the state detecting unit 1a and the state judging unit 2a are as described above, further description of the same will be omitted. An RGB character circuit 8a is a circuit for generating a character to indicate a state judged by the state judging unit 2a. The character generated from the RGB character circuit 8a is combined in an adder 7a with a video signal picked up by a CCD 5 and passed through a signal processing unit 6. The combined signal is used for character displaying in the color view finder 4a. The output signal of the signal processing unit 6 is also connected as a video output with an external monitor 9a and the like to provide an image. The manner of displaying the character in a color or in a flashing manner in the color view finder 4a is controlled by the controlling unit 3a.

In the above video camera, it can be easily confirmed at the time of the picture taking whether or not the tape is at its end, dew is condensed, the battery is used up, and how much the remaining capacity of the battery is by having the state detected by the state detection means 1 and the state judgment means 2 displayed in a color as shown in FIG. 5 and FIG. 6.

FIG. 4 to FIG. 6 are diagrams showing particular examples of character displays. In FIG. 4 are shown particular examples of normal displays, in FIG. 5 are shown particular examples of warning displays, and in FIG. 6 are shown particular examples of displays indicating remaining capacity of the battery.

FIGS. 4(A) to 4(D) show normal displays. Such character displays are displayed in white color in the color view finder 4a in FIG. 2. Description of the displays in FIG. 4 will be given below assuming that each display is displayed in a predetermined position of a character display portion 10.

Figure 4A:
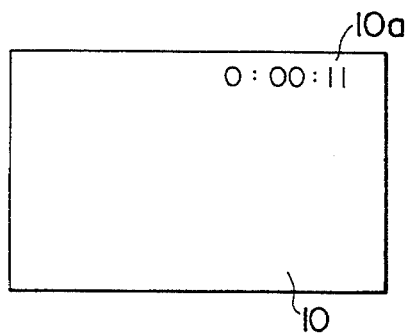
FIG. 4(A)–4(D) are diagrams showing particular examples of normal displays in a video camera according to the present invention.

FIG. 4(A) shows a counter display 10a in the character display portion 10, in which the tape position of the video tape is counted.

Figure 4B:
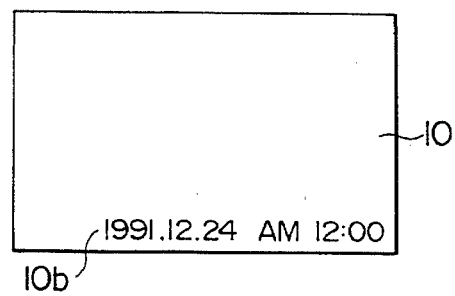
Figure 4C:
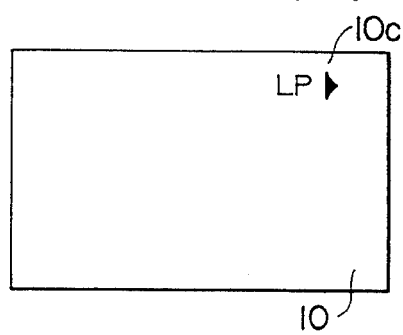

FIG. 4(B) shows a date and time display 10b in the character display portion 10, in which the date and time of the picture taking by the video camera are specified. FIG. 4(C) shows a mode of VTR display in the character display portion 10, in which an indication of LP (long play) mode 10c is now being displayed.

Figure 4D:
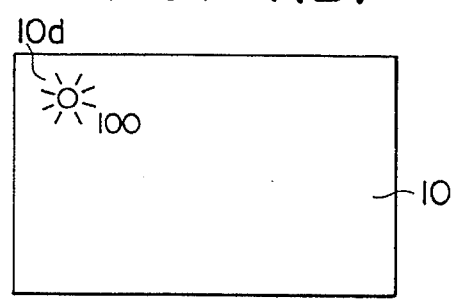

FIG. 4(D) shows a camera mode display in the character display portion 10, in which the symbol of sun indicates white balance and numeral 100 indicates the shutter speed 10d.

All the above normal displays are displayed in white color. By identifying for sure the information represented by the displays, such information can be confirmed.

FIGS. 5(A) to 5(C) and FIGS. 6(A) to 6(D) are diagrams showing warning displays and battery remaining capacity displays, respectively.

Figure 5A:
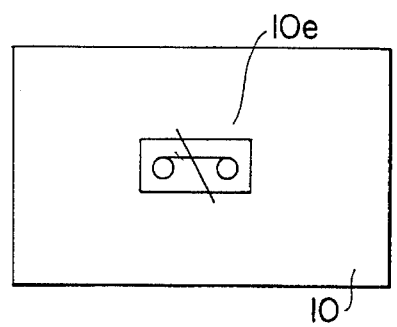
FIGS. 5(A)–5(C) are diagrams showing particular examples of warning displays in a video camera according to the present invention.
Figure 5B:
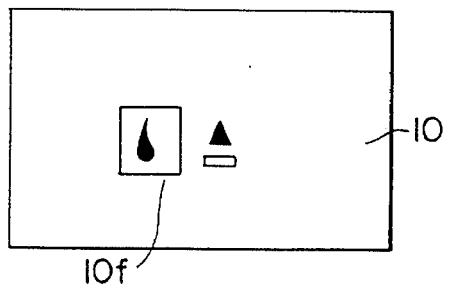
Figure 5C:
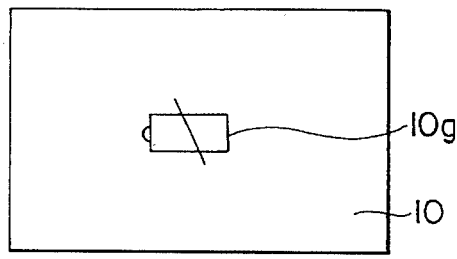

The displays in FIG. 5(A) to FIG. 5(C) may be given in flashing red color so that they appeal to the visual sensation that they are warning displays.

FIG. 5(A) shows a tape end display 10e in the character display portion 10, which indicates that the video tape is at its end or there is no tape loaded in the apparatus.

FIG. 5(B) shows a dew condensation display 10f in the character display portion 10 indicating that there is dew condensation on the drum and the video cassette is required to be ejected. FIG. 5(C) shows a battery end display 10g in the character display portion 10 indicating that the battery is used up.

The above warning displays may be displayed in flashing red color to appeal to the visual sensation so that a necessary step is immediately taken by the user.

FIG. 6(A) to FIG. 6(D) show remaining capacity of the battery. The display in FIG. 6(A) in green color 10h in the character display portion 10 indicates the "FULL" state, and as the capacity is decreased, the display is successive changed through that in yellow color 10i in the character display portion 10 shown in FIG. 6(B) to that in orange color 10j in the character display portion 10 shown in FIG. 6(C). In the "EMPTY" state, the display in the character display portion 10 becomes that flashing in red color 10k.

In the above display of the remaining capacity of the battery, by causing the RGB character circuit 8a to simultaneously output changed levels of red, green, and blue colors, the character display portion 10 can make displays in different four colors appealing to the visual sensation, and therefore, the user can recognize the remaining capacity of the battery according to the color quickly and certainly.

FIG. 3 is a diagram showing an embodiment other than the embodiment shown in FIG. 2. While the case where the RGB character circuit 8a and the adder 7a are disposed in the camera portion was shown in FIG. 2, FIG. 3 is different from it in that an RGB character circuit 8b and an adder 7b are disposed in the color view finder. Since the circuit configuration for the camera portion becomes simpler by such arrangement, the camera portion can be made smaller in size.

The above described embodiments not only ensure that the user of the video camera can discriminate between the normal display and the warning display but also increase the capability of the camera user to visually recognize the warning display so that the user can respond to the warning quickly and accurately.

Since the level indication of the remaining capacity of the battery is arranged to be identifiable by four colors, its recognizability can be improved while the display area is made narrower.

Figure 8:
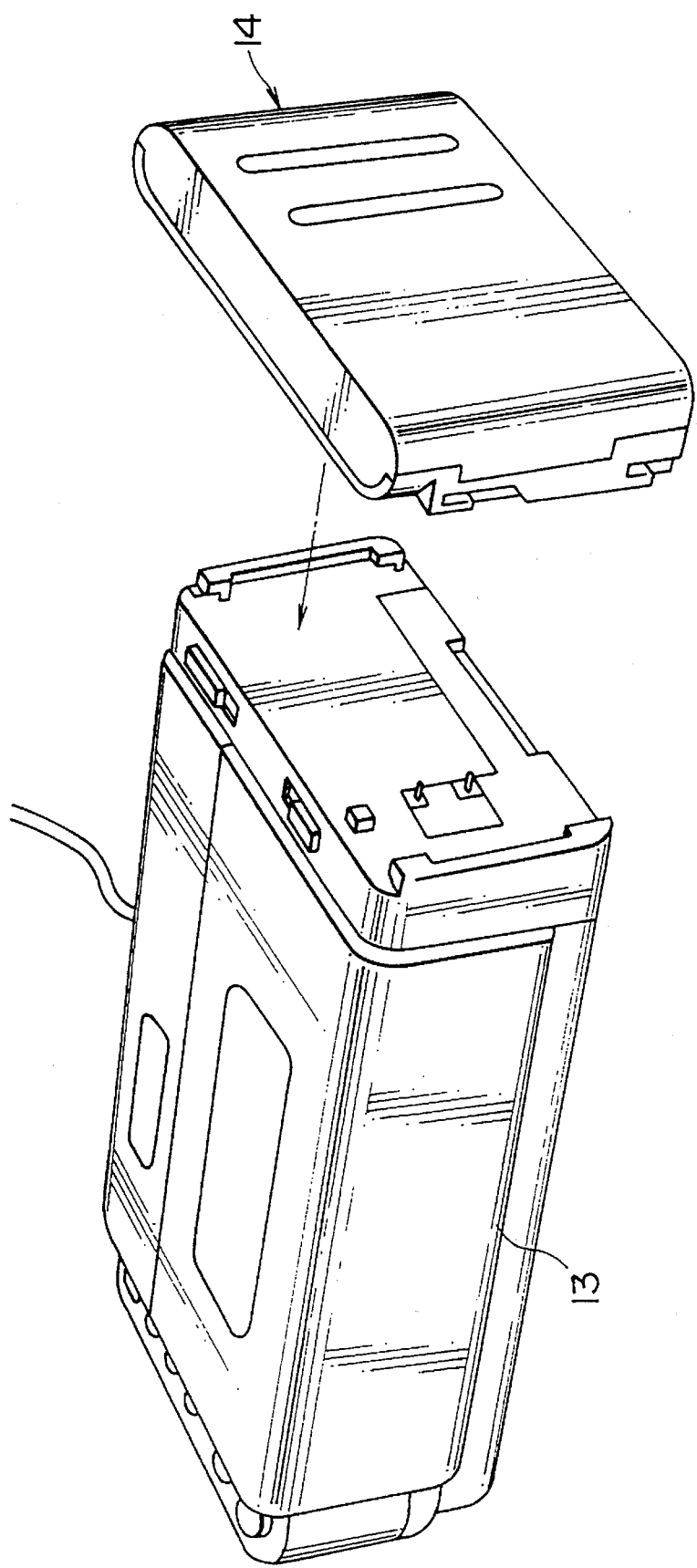
FIG. 8 is a diagram showing a portable recording/reproducing apparatus.

Although the arrangement to have some characters or warnings displayed in the color view finder of a video camera has been described above, the present invention is not limited to such arrangement. For example, it can be embodied in a portable recording/reproducing apparatus as shown in FIG. 8. Referring to FIG. 8, reference numeral 13 denotes a portable video tape recorder and a battery 14 is adapted to be detachably attached to the video tape recorder. It may be arranged such that the state of the video tape recorder is detected and the warning indication is displayed on a monitor to be externally attached to the video tape recorder.

Figure 7:
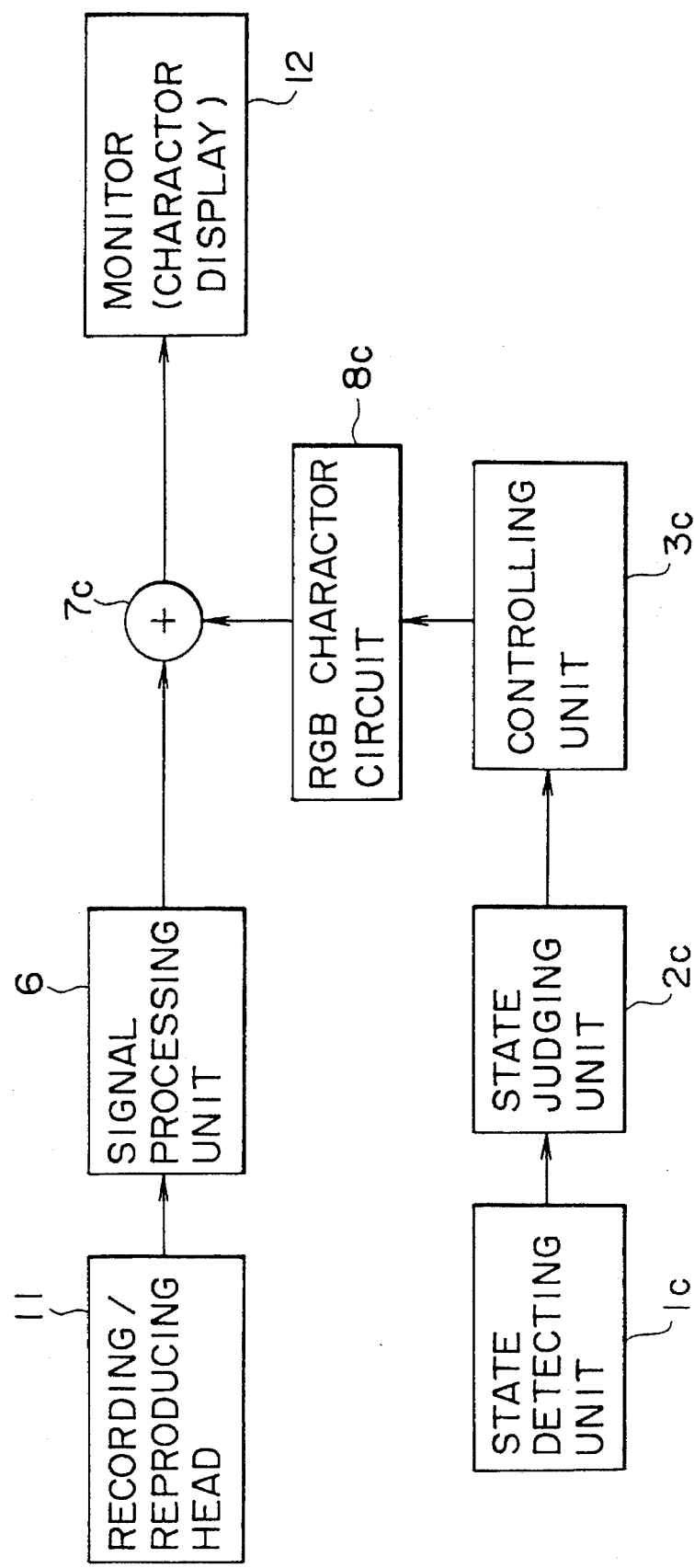
FIG. 7 is a block diagram showing a case where the present invention is embodied in the recording/reproducing apparatus shown in FIG. 8.
Figure 9:
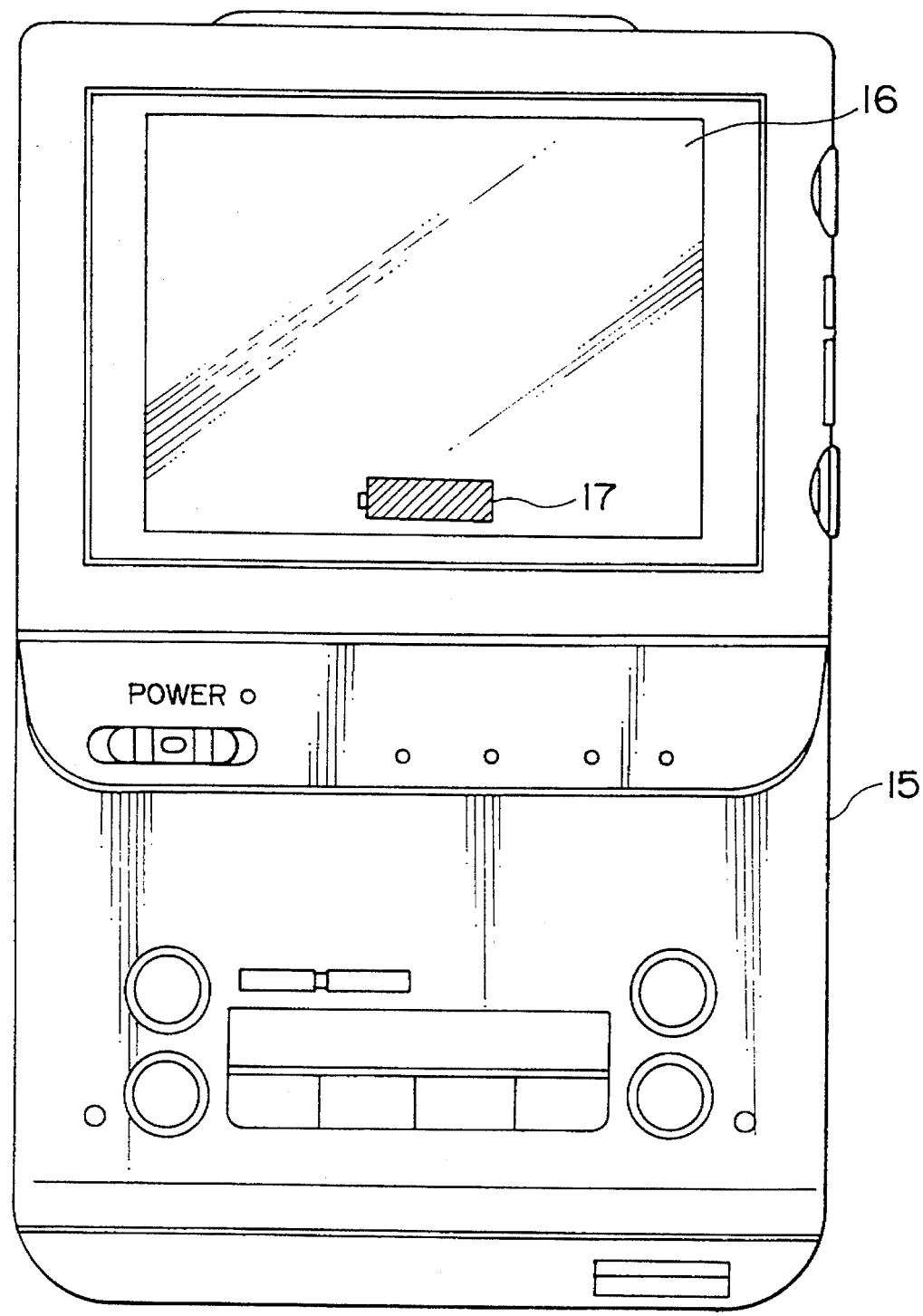
FIG. 9 is a diagram showing a video tape recorder with a monitor incorporated therein.

FIG. 7 is a block diagram showing a case where the present invention is embodied in the recording/reproducing apparatus shown in FIG. 8. The arrangement in FIG. 7 is different from that in FIG. 2 in that a video signal from a recording/reproducing head 11 is input to the signal processing unit 6 and the signal from an RGB character circuit 8c is combined with the video signal and displayed as characters on the monitor 12. The monitor may be externally connected to a video tape recorder as shown in FIG. 8 or the monitor may be integrated with a video tape recorder as shown in FIG. 9. Referring to FIG. 9, reference numeral 15 denotes an integral arrangement of the video tape recorder and the monitor. In this case, the battery (not shown) is arranged to be attached to the back side of the apparatus. A character display 17 may be made in the monitor portion 16. In the character display, the states of tape end, dew condensation on drum, and battery end may be indicated as shown in FIG. 5. Displays for identifying the remaining capacity of the battery may be made as shown in FIG. 6.

According to the present invention as described in the foregoing, various excellent merits can be obtained. Namely, it is ensured that the user of the video camera can discriminate between the normal display and the warning display and the capability of the user to visually recognize the warning display is increased so that the user can respond to the warning quickly and accurately. Further, since the indication of levels of the remaining capacity of the battery is arranged to be identifiable by four colors, recognizability of it is improved despite that the display area is made narrower.

What is claimed is:

1. An electronic apparatus for providing an indication on a display device representative of a remaining capacity of a battery which supplies power to said apparatus, said apparatus comprising:

detection means for detecting the remaining capacity of said battery; and display controller means for controlling said display device so as to cause the indication representative of the remaining capacity of said battery to be displayed on said display device in one of at least four colors dependent upon the detected remaining capacity of said battery, in which the color of said indication is green when the remaining capacity of said battery is detected as being a full capacity, the color of said indication is red when the remaining capacity of said battery is detected as being substantially zero, and the color of said indication is one of yellow and orange when the remaining capacity of said battery is detected as being between said full capacity and substantially zero, said display controller means further causes said indication representative of the remaining capacity of said battery to flash on said display device when said remaining capacity of said battery is detected as being substantially zero so as to cause a flashing red indication on said display device.

2. An apparatus according to claim 1, wherein said electronic apparatus is a video tape recorder.

3. An apparatus according to claim 2, wherein said video tape recorder is a video camera-recorder having a view finder.

4. An apparatus according to claim 2, wherein said video tape recorder has a monitor incorporated therein.

* * * * *